US011152192B2

(12) United States Patent
Yasui et al.

(10) Patent No.: US 11,152,192 B2
(45) Date of Patent: Oct. 19, 2021

(54) PLASMA PROCESSING APPARATUS AND METHOD

(71) Applicant: HITACHI HIGH-TECHNOLOGIES CORPORATION, Tokyo (JP)

(72) Inventors: Naoki Yasui, Kudamatsu (JP); Norihiko Ikeda, Hiroshima (JP); Tooru Aramaki, Kudamatsu (JP); Yasuhiro Nishimori, Hikari (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/218,703

(22) Filed: Dec. 13, 2018

(65) Prior Publication Data

US 2019/0115193 A1    Apr. 18, 2019

Related U.S. Application Data

(62) Division of application No. 13/590,242, filed on Aug. 21, 2012, now abandoned.

(30) Foreign Application Priority Data

Jul. 6, 2012  (JP) .................. 2012-152005

(51) Int. Cl.
H01L 21/3065 (2006.01)
H01J 37/32 (2006.01)

(52) U.S. Cl.
CPC .. *H01J 37/32192* (2013.01); *H01J 37/32082* (2013.01); *H01J 37/32642* (2013.01); *H01L 21/3065* (2013.01)

(58) Field of Classification Search
CPC ................................................ H01J 37/32642
(Continued)

(56) References Cited

U.S. PATENT DOCUMENTS 5,900,064 A    5/1999   Kholodenko
5,942,039 A    8/1999   Kholodenko et al.
(Continued)

FOREIGN PATENT DOCUMENTS

JP    2005-260011 A   9/2005
JP      3881290 B2    2/2007
(Continued)

OTHER PUBLICATIONS

Han et al., Plasma etching apparatus for semiconductor device manufacturing apparatus, has electrostatic chuck holding wafer to be etched, and focus ring with tapered surface surrounding edge of wafer, Apr. 3, 2008, Hynix Smiconductor Inc., abstract.

*Primary Examiner* — Sylvia MacArthur
*Assistant Examiner* — Michelle Crowell
(74) *Attorney, Agent, or Firm* — Baker Botts L.L.P.

(57) ABSTRACT

To improve processing uniformity by improving a working characteristic in an edge exclusion region. Provided is a plasma processing apparatus for processing a sample by generating plasma in a vacuum vessel to which a processing gas is supplied and that is exhausted to a predetermined pressure and by applying a radio frequency bias to a sample placed in the vacuum vessel, wherein a conductive radio frequency ring to which a radio frequency bias power is applied is arranged in a stepped part formed outside a convex part of the sample stage on which the wafer is mounted, and a dielectric cover ring is provided in the stepped part, covering the radio frequency ring, the cover ring substantially blocks penetration of the radio frequency power to the plasma from the radio frequency ring, and the radio frequency ring top surface is set higher than a wafer top surface.

7 Claims, 4 Drawing Sheets

(58) Field of Classification Search
USPC ........................................................ 156/915
See application file for complete search history.

(56) References Cited

U.S. PATENT DOCUMENTS

| | | |
|---|---|---|
| 7,025,858 B2 | 4/2006 | Chou |
| 7,658,816 B2 | 2/2010 | Koshiishi et al. |
| 8,426,317 B2 | 4/2013 | Koshimizu |
| 2003/0201069 A1 | 10/2003 | Johnson |
| 2004/0040663 A1 | 3/2004 | Udo et al. |
| 2005/0230049 A1* | 10/2005 | Nishio .............. H01J 37/32935 156/345.51 |
| 2007/0169891 A1 | 7/2007 | Koshiishi et al. |
| 2007/0175586 A1 | 8/2007 | Tetsuka et al. |
| 2007/0215279 A1 | 9/2007 | Koshiishi |
| 2008/0236751 A1* | 10/2008 | Aramaki ........... H01L 21/32137 156/345.43 |
| 2008/0258082 A1* | 10/2008 | Okumura .......... H01L 21/68735 250/492.3 |
| 2009/0000744 A1 | 1/2009 | Dhindsa et al. |
| 2009/0071938 A1 | 3/2009 | Dhindsa et al. |
| 2010/0159703 A1* | 6/2010 | Fischer ............ H01J 37/32091 438/710 |
| 2011/0021031 A1* | 1/2011 | Taylor ................. C04B 35/593 438/724 |
| 2012/0061351 A1 | 3/2012 | Ohata et al. |
| 2013/0174105 A1 | 7/2013 | Nishio et al. |

FOREIGN PATENT DOCUMENTS

| | | | | |
|---|---|---|---|---|
| JP | 2007-329499 A | 12/2007 | | |
| JP | 2010-283028 A | 12/2010 | | |
| KR | 20100092348 A | * | 8/2010 | ........ H01J 37/32091 |

* cited by examiner

PLASMA PROCESSING APPARATUS AND METHOD

CLAIM OF PRIORITY

The present application is a divisional of U.S. patent application Ser. No. 13/590,242 filed on Aug. 21, 2012, which claims priority from Japanese patent application JP 2012-152005 filed on Jul. 6, 2012, the contents of all of which are hereby incorporated by reference herein.

FIELD OF THE INVENTION

The present invention relates to a plasma processing apparatus and a processing method for processing a sample, and more specifically, to a plasma processing apparatus for processing a sample while applying a radio frequency bias to the sample in an etching processing of the sample using plasma.

BACKGROUND OF THE INVENTION

Generally, dry etching using plasma is performed in a semiconductor manufacturing process. The plasma processing apparatus for performing dry etching uses various systems.

On the other hand, with an improvement in integration degree of the recent semiconductor devices, improvement of micro fabrication, i.e., working accuracy is required, and at the same time, improvement of in-wafer uniformity of an etching rate or in-wafer uniformity of the CD (Critical Dimension) value in an etched shape, and the like are required.

Moreover, along accelerating miniaturization in a manufacture process of the semiconductor device, uniformity of the etching characteristic as much as an order of nanometer or subnanometer is being required. Especially, in etching of multilayer films, degrees of influences that a large number of parameters (for example, an excitation power of plasma, the kind of processing gas, a mixing ratio of the processing gases, a gas pressure, a RF bias power, temperature setting of an electrode, a reactor wall, etc., and the like) affect a etched profile as a device performance are serious. For this reason, it becomes more and more difficult to achieve in-wafer uniformity of a high accuracy in the etching rate and the etched profile (for example, the CD) after etching of the multilayer films.

In the etching process as described above, especially in a surrounding of a wafer outer peripheral part has a larger difference in a performance of the process as compared with a central part of the wafer because of electromagnetic and thermodynamic factors, which makes nonuniformity in a plane of the wafer notably appear, which becomes a problem to be solved. For example, a processed profile in a surrounding of the outer peripheral part that is obtained after the processing is such that a difference of a size from that in the central side portion becomes out of an allowable range, and therefore the semiconductor devices obtained by processing in the outer edge part of the wafer cannot be provided.

Such a region that is the wafer outer edge part and is not used in semiconductor device manufacture is called an edge exclusion (E. E.), and a size of this E. E. region has becomes a factor that decides a price of the semiconductor device largely in manufacture of memory devices in recent years. Because of this, reduction of the E.E. region is especially required in recent years; specifically, the length of a radial direction of the E.E. region is required to be equal to or less than 2 mm, or further to be equal to or less than 1 mm.

As an improvement technology of improving wafer plane uniformity in the plasma processing apparatus in order to reduce this E.E. region as small as possible, and thus to increase the number of chips obtainable from a wafer, for example, what are disclosed in Japanese patent No. 3881290 and Japanese Patent Application Laid-Open Publication No. 2005-260011 are known.

Japanese Patent No. 3881290 discloses a plasma processing apparatus that has an object of performing uniform processing over a wafer surface and that has a processing chamber for processing a sample, a vacuum exhaustion unit to reduce a pressure of the processing chamber, a processing gas supply unit to supply a processing gas into the processing chamber, a sample holding unit to hold the sample to be processed in the processing chamber, a RF bias applying unit to apply a RF bias potential to the sample holding unit, and a plasma generating unit to generate plasma in the processing chamber in which a top surface of the sample holding unit has a step, the sample is mounted on its uppermost stage, a ring-shaped part made of a dielectric to which a bias electric potential can be applied is provided on a surface lower than a sample mounting surface, a top surface of the ring-shaped part is equal to or lower than the top surface of the sample, and a part made of a dielectric covers the top surface of the ring-shaped part.

Japanese Patent Application Laid-Open Publication No. 2005-260011 discloses a wafer processing apparatus that has an object of processing the etched profile vertically as far as the wafer outer periphery and performs a processing on a semiconductor wafer using plasma, in which a wafer stage for mounting a wafer is made of a conductive material having a convex shape as a wafer mounting part, and is configured to have a disk to which a radio frequency electric field is applied and a ceramic-made dielectric film attached to a surface of the disk, the convex part has a smaller diameter than a diameter of the wafer, and a ring-shaped part made of a conductor whose inside diameter is larger than a diameter of the convex part and is smaller than a diameter of the wafer, whose thickness is less than or equal to the height of the convex part, and at least to whose top surface a ceramic-made dielectric film is fixed is attached on the outer periphery of the convex part.

SUMMARY OF THE INVENTION

These conventional technologies described above relate to an electromagnetic problem in a surrounding of the wafer outer peripheral part in order to reduce an E. E. region, especially to a technology of improving a curvature of an equipotential surface formed on the wafer. These conventional technologies are technologies so as to achieve an uniform etching result by arranging a ring-shaped conductor, called a radio frequency edge ring, on an outer peripheral side of the wafer and making a plasma ion sheath distribution on the wafer uniform from the center to the outer periphery through adjustment of an electric field distribution with a conductive part to which electric power is supplied.

Through further repeated investigations on the conventional technological constitution described above, the inventors have acquired a finding that although a limitation of improvement in the uniformity is recognized in the surrounding of the wafer peripheral part, there can be enumerated the following point as its cause.

That is, in configurations of Japanese patent No. 3881290 and Japanese Patent Application Laid-Open Publication No.

2005-260011, it is premised that a radio frequency bias power applied to a sample stage couples with plasma through a cover ring provided on an outer peripheral part of the sample stage, and the height of a top surface of the radio frequency edge ring arranged at the outer periphery of the wafer is set to be equal to or lower than a top surface of the sample. That is, the RF bias power is coupled with the plasma though the cover ring, the curvature of the equipotential surface in a surrounding of a wafer outer peripheral part is corrected by a plasma ion sheath forming on a top surface of the cover ring.

Such a cover ring has material and size (thickness) decided considering several conditions on a design (in view of part shape, manufacturability, lifetime, etc. on performance) and is provided on the outer peripheral part of the sample stage. However, there is a case where the material is limited in consideration of an etching process, and even if the shape is the optimum, in some cases, the applied radio frequency bias power cannot transfer the cover ring that is formed a certain finite thickness, that is, the electric power for bias supplied to the cover ring and the plasma cannot couple with each other, and it may be impossible to form an expected plasma ion sheath on the top surface of the cover ring, namely, to form the plasma ion sheath having the same thickness as that of the plasma ion sheath on the wafer surface.

In such a case, since the plasma ion sheath is not formed with a desired thickness on the surrounding of the wafer outer periphery, it is difficult to correct the curvature of the equipotential surface to a desired shape. Therefore, it is difficult to make a trajectory of charged particles from the plasma that is induced towards a wafer top surface in the E.E. region be in an allowable range including perpendicularity to the wafer top surface by correcting the curvature of the equipotential surface in the wafer outer edge part and its surrounding in the E.E. region. Thus, the conventional technology is insufficient to fully improve the uniformity of an etching rate in an E.E. part, and how to further make small the E.E. region is not considered thoroughly.

FIG. 5A shows a structure using the conventional technology. A longitudinal section of a sample stage 111 has a convex shape towards the above in its upper part, and a diameter of the top surface is made smaller than the diameter of a wafer 112 by about a few mm. An outer periphery side of the sample stage 111 has a stepped part (a concave part) that is made lower than the convex part by one step. On surfaces of the convex part and the stepped part of the sample stage 111, a dielectric film for electrostatic chuck whose illustration is omitted is formed. On the top surface of the stepped part (the concave part) of the sample stage 111, a conductive radio frequency ring 117a whose inside diameter is still larger than the diameter of the wafer 112 is provided with a distance provided from the convex part side face on the dielectric film. The height of a top surface of the radio frequency ring 117a is set equal to or lower than that of a wafer 112 top surface.

Moreover, in order to prevent the convex part outer peripheral side face of the sample stage 111 and the top surface of the stepped part (the concave part) of the radio frequency ring 117a from contacting with the plasma, a cover ring 118a made of a dielectric material is arranged on the stepped part. The cover ring 118a is formed in a tapered shape such that an upper part of its inner side face opposing an outer periphery of the wafer 112 expands towards the above. An inner side lower part of a cover ring 118a, i.e., a lower portion of the tapered part engages with the convex part outer periphery of the sample stage 111 and is set equal to or slightly lower than a wafer mounting surface, so that when the wafer is mounted on the sample stage, it is positioned underneath the back side of outer periphery the wafer.

When the wafer 112 is mounted during plasma processing, this cover ring 118a reduces, an area of the top surface and side face of the sample stage 111 in direct contact with the plasma, and suppresses damage of an electrode surface and depletion of the electrode surface caused by the plasma. Incidentally, the cover ring 118a is made of the dielectric material having plasma resistance, such as quartz and ceramic materials of alumina, etc. It is thought that the cover ring 118a made of the dielectric acts as a capacity component to the radio frequency bias applied to the sample stage 111, and its impedance for the radio frequency bias is reduced like a conductor.

When the plasma is generated, a space charge layer called the plasma ion sheath is formed on a surface of a substance that comes in contact with the plasma resulting from a mass difference between electron and ion. By the radio frequency power for bias being supplied to the wafer 112 from a radio frequency power generator whose illustration is omitted through the sample stage 111, the radio frequency power make a larger negative electric potential at the sample stage 111, in other words, the plasma ion sheath thickness is thicker with applying the radio frequency power than without applying one. Here, a symbol 201a shown in the figure shows the equipotential surface in the electric field in the plasma ion sheath. A symbol 202a shows the trajectory of the ions drawn by the electric field. A symbol 203a shows a plasma ion sheath region, and a symbol 204a shows a plasma region.

In this case, since the cover ring 118a acts as a conductor to the radio frequency bias, when the top surface of the radio frequency ring 117a is the same height as the wafer 112 top surface, the same plasma ion sheath as that on the wafer 112 is formed also over the cover ring 118a on the radio frequency ring 117a to the plasma. For this reason, as shown in the figure, the equipotential surface 201a becomes almost parallel to the wafer 112, and in connection with this, the trajectory 202a becomes almost perpendicular to the wafer 112. Thereby, an etching processed profile is improved in a surrounding of an outer peripheral part of the wafer 112.

However, since the ion also incident to the cover ring 118a with the same energy as that of the wafer surface, there still remain problems that particles are generated from the cover ring 118a and depletion of the cover ring 118a is increasing.

Moreover, depending on a material and a thickness of the cover ring 118a, there is a case where it cannot be regarded as a conductor for the radio frequency bias, which is shown in FIG. 5B. The same symbol as that of FIG. 5A shows the same component, and its explanation is omitted. A point in which FIG. 5B differs from FIG. 5A is a point that a cover ring 118b is specified to be one through which a radio frequency electric field cannot penetrate, or is difficult to transfer. In this case, since the radio frequency bias does not transfer above the cover ring 118b on the radio frequency ring 117a, it does not act to the electrons and ions in the plasma. For this reason, the potential of the plasma ion sheath over the cover ring 118b becomes equal to a plasma ion sheath potential produced only by the plasma, and the plasma ion sheath is a thin thickness. Thereby, as shown in the figure, an equipotential surface 201b in the electric field in the plasma ion sheath curves downward and becomes low in the outer peripheral part of the wafer 112. By this gradient of the equipotential surface, a trajectory 202b of the ions drawn by the electric field is bending obliquely from the outside on the surrounding of the outer peripheral part of the wafer 112.

Thereby, the etching profile is impaired in the surrounding of the outer peripheral part of the wafer 112. That is, since the ions are not incident perpendicularly on the wafer 112 in an outer peripheral edge of the wafer 112 but are incident on the wafer 112 with a certain angle, an etched profile cannot keep the vertical shape. Moreover, when comparing with that of the center side (a region other than the outer peripheral part) of the wafer 112, the number of the ions incident on the outer peripheral part (E. E. part) of the wafer 112 increases, and the etching rate of the outer peripheral part (E. E. part) of the wafer 112 increases. For this reason, the etching rate in the outer peripheral part (E. E. part) of the wafer 112 is different from the etching rate of the central side portion of the wafer 112, and in-wafer uniformity of a processing characteristic of the wafer 112 will be degraded.

Moreover, since the height of the equipotential surface in the radio frequency ring part is set equal to or lower than the wafer top surface, when the radio frequency bias power supplied to the sample stage varies, the plasma ion sheath potential on the wafer varies accordingly, and the plasma ion sheath potential difference between on the wafer and the radio frequency ring part outside the wafer outer periphery, as it is, affects the equipotential surface in the plasma ion sheath, i.e., a shape of the whole equipotential surface above the wafer is bended by each power setting, it is getting more difficult to set process recipe under different power setting at each etching step.

The object of the present invention is to provide a plasma processing apparatus and its method that can improve uniformity of a fine processing performance and improving an etching performance of the edge exclusion (E. E.) region. The above-mentioned object is achieved by a plasma processing apparatus for processing a sample placed on the sample stage by generating plasma in the processing chamber to which a processing gas is supplied and that is exhausted to reduce its pressure to a predetermined pressure and at the same time by applying the radio frequency bias to the sample stage provided in the processing chamber, in which a conductor ring to which the radio frequency bias is applied is provided outside the sample outer periphery on the sample stage to which the radio frequency bias is applied, the conductor ring is covered with a dielectric cover that controls the plasma ion sheath formed above it to substantially have the plasma ion sheath potential produced only by plasma generation, and the height of the equipotential surface in the lowermost part in the plasma ion sheath above the conductor ring is set higher than the top surface of the sample placed on the sample stage.

Moreover, the above-mentioned object is achieved by a plasma processing apparatus that has the processing camber that is placed in the vacuum vessel and whose interior is decompressed, and the sample stage that is placed in this processing chamber and holds a wafer to be processed mounted on its top surface, and processes the wafer using plasma formed in the processing chamber while applying the radio frequency bias power thereto, in which the apparatus has a ring-shaped part made of a conductor that is arranged in a stepped part arranged encircling the wafer placed on the sample stage on an outer periphery side of a plane holding the wafer and to which the radio frequency bias power applied to an electrode in the sample stage is applied, and the cover that is arranged in the stepped part covering the top surface and the inner periphery side of the ring-shaped part and is comprised of a dielectric material, the radio frequency power applied to the ring-shaped part is not coupled to the plasma, and a top surface of the ring-shaped part is set higher than the wafer top surface.

Moreover, the above-mentioned object is achieved by a plasma processing method having the steps of: generating plasma in a processing chamber to which a processing gas is supplied and that is exhausted to reduce its pressure to a predetermined pressure, applying a radio frequency bias to the sample stage provided in the processing chamber, and therefore processing a sample placed on the sample stage, in which the plasma ion sheath formed outside a sample outer periphery of the sample stage to which the radio frequency bias is applied is controlled to substantially have the plasma ion sheath potential produced only by the plasma generation, and the height of an equipotential surface at a lowermost part in the plasma ion sheath outside a sample periphery is set higher than the top surface of the sample to effect the processing of the sample.

Moreover, the above-mentioned object is achieved by a plasma processing method having the steps of: placing and holding the wafer to be processed on a top surface of a sample stage arranged in the processing chamber whose interior is decompressed, and applying the radio frequency bias power to an electrode arranged in the sample stage from the radio frequency power supply, in which the sample stage has a ring-shaped part made of a conductor that is arranged in the stepped part arranged encircling the wafer on the outer periphery side of the plane holding the wafer and to which the radio frequency bias applied to an electrode in the sample stage is applied, and a cover comprised of the dielectric material arranged in the stepped part covering a top surface and an inner periphery side of the ring-shaped part, the top surface of the ring-shaped part being set higher than the wafer top surface, and the radio frequency bias power applied to the ring-shaped part is uncoupled to the plasma.

Moreover, the above-mentioned object is achieved by a plasma processing method of processing a sample, having the steps of: generating plasma in a vacuum vessel that is exhausted to decompress its pressure to a predetermined pressure, and at the same time applying the radio frequency bias to the sample stage on which a sample is mounted in the vacuum vessel and a conductor ring provided to encircle the sample outside the sample mounting surface of the sample stage, in which the conductor ring is covered with a dielectric cover, an electric potential of the plasma ion sheath formed above the conductor ring by application of the radio frequency bias is substantially set to an electric potential produced by the plasma generation, the thickness of the plasma ion sheath is thinned, the height of the equipotential surface below the plasma ion sheath is set higher than the equipotential surface of a processing surface of the sample to effect the processing of the sample.

DETAILED DESCRIPTION OF THE PREFERRED EMBODIMENTS

The present invention makes a plasma ion sheath formed outside a wafer outer periphery of a sample stage to which a radio frequency bias is applied substantially have a plasma ion sheath potential produced only by plasma generation, and sets the height of an equipotential surface by an electric field in the plasma ion sheath outside the wafer outer periphery higher than a wafer top surface. That is, the thickness of the plasma ion sheath outside the wafer outer periphery is set to be constant irrespective of a magnitude of a radio frequency bias power, and in this state, the equipotential surface is set higher than the wafer top surface, so that depression of the equipotential surface is suppressed in a wafer outer peripheral part. By this, an influence of alteration of the radio frequency bias power is reduced, and an incident angle of ions incident on the wafer outer peripheral part (E. E. region) is kept substantially perpendicularly.

Hereafter, an embodiment carried out by the present invention will be explained using drawings.

Embodiment

Figure 1:
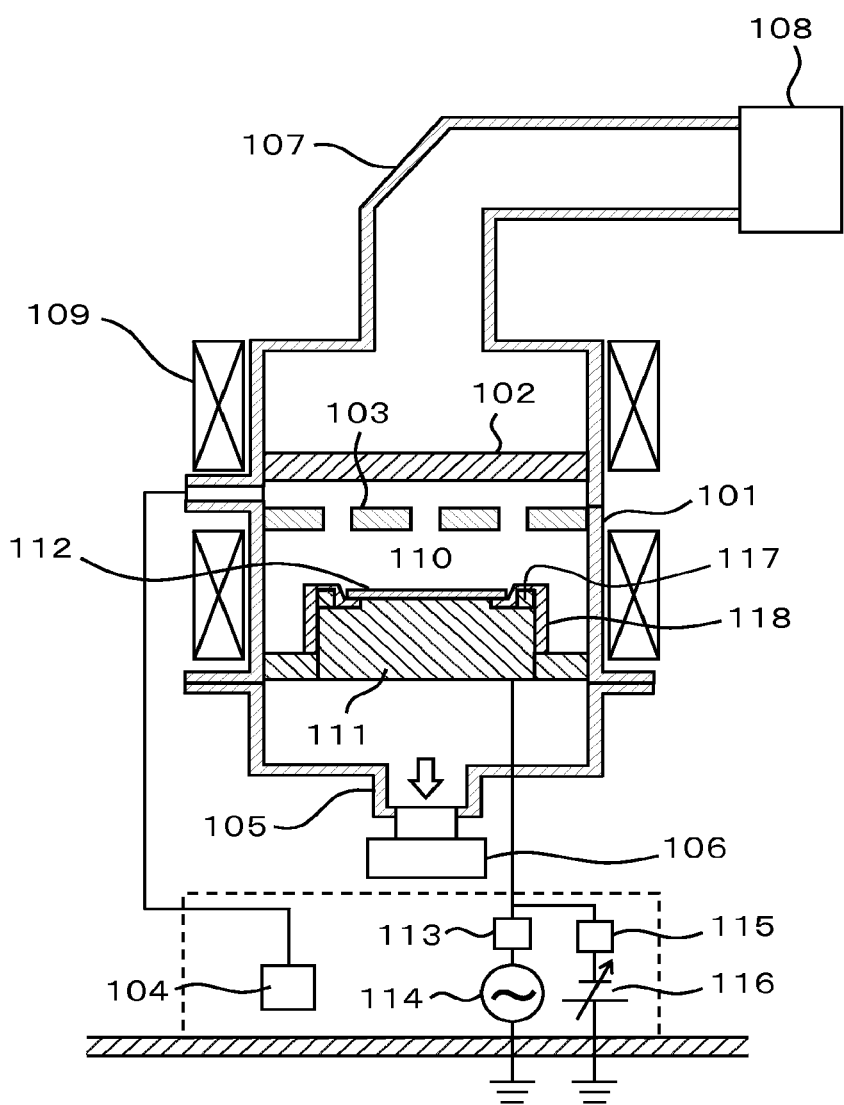
FIG. 1 is a vertical sectional view schematically showing an outline of a configuration of a plasma processing apparatus that is one embodiment of the present invention.

Below, an embodiment of the present invention will be explained using FIG. 1 to FIG. 4. FIG. 1 is a longitudinal sectional view schematically showing an outline of a configuration of a plasma processing apparatus according to the embodiment of the present invention. The plasma processing apparatus of this embodiment shows an etching processing apparatus for forming plasma (microwave ECR plasma) using ECR (Electron Cyclotron Resonance) by microwave.

The plasma processing apparatus is constructed as follows in this case. A disk-shaped dielectric window 102 made of, for example, quartz is provided in an upper opening of a vacuum vessel 101 whose interior is of a cylindrical shape. A shower plate 103 made of a dielectric (for example, made of quartz) in which multiple through holes for introducing a gas for etching were provided is arranged below the dielectric window 102. A supply path of a gas is formed between the shower plate 103 and the dielectric window 102, and is linked with a gas supply device 104. A vacuum exhaust port 105 is arranged in a lower part of the vacuum vessel 101 and is connected with a vacuum exhaust system 106.

Above the dielectric window 102, a waveguide 107 for transmitting a microwave electromagnetic field into the vacuum vessel 101 is arranged. A magnetron 108 for oscillating a microwave is arranged at an end of the waveguide 107. A magnetic field generating coil 109 for forming a magnetic field in its interior is arranged in the outer peripheral part of the vacuum vessel 101. The electromagnetic field oscillated by the magnetron 108 is converted into a predetermined electric field mode in an expanded waveguide part for resonance that is formed at an other end after propagating through the waveguide 107, which subsequently transfers the dielectric window 102 and the shower plate 103 and is introduced into a processing chamber 110 formed between the shower plate 103 and a sample stage 111.

Although the frequency of the microwave is not limited in particular, this embodiment uses 2.45-GHz microwave. The electric field of the microwave introduced into the processing chamber 110 excites a gas for etching that was supplied to the processing chamber 110 through the shower plate 103 by an interaction with the magnetic field produced by the magnetic field generating coil 109 to generate plasma in the processing chamber 110.

In the interior of the vacuum vessel 101, the sample stage 111 that faces the dielectric window 102 is arranged to have a distance below the shower plate 103 so that the processing chamber 110 may be formed. In the sample stage 111, its top surface is covered with a coat (illustration being omitted) of a dielectric material that is formed by thermal spraying, and a sample to be processed, in this case a wafer 112, is mounted and held on the top surface of the coat. A mounting surface on which the wafer 112 is mounted faces the dielectric window 102 and the shower plate 103.

The sample stage 111 is formed in a convex shape whose top surface has a slightly smaller outside diameter than the wafer diameter and has a substantially circular plane. Although illustration is omitted, inside the coat made of the dielectric on a top surface of the convex part, a sheet-shaped electrode for electrostatic attraction comprised of a conductor material is arranged. A direct current power generator 116 is connected to the electrode for electrostatic chuck through a radio frequency filter circuit 115. Furthermore, the sample stage 111 forms an approximately cylindrical shape, and is arranged with its axis aligned with an axis of the vacuum vessel 101, and there is an electrode for radio frequency bias application below the coat made of the dielectric. A radio frequency power generator 114 is electrically connected to the electrode for radio frequency bias application through a matching circuit 113. In this case, the radio frequency bias power supplied from the radio frequency power generator 114 has a frequency in a range of about a few hundreds Hz to 50 MHz, more preferably, in a range of 400 Hz to 40 MHz.

Figure 2:
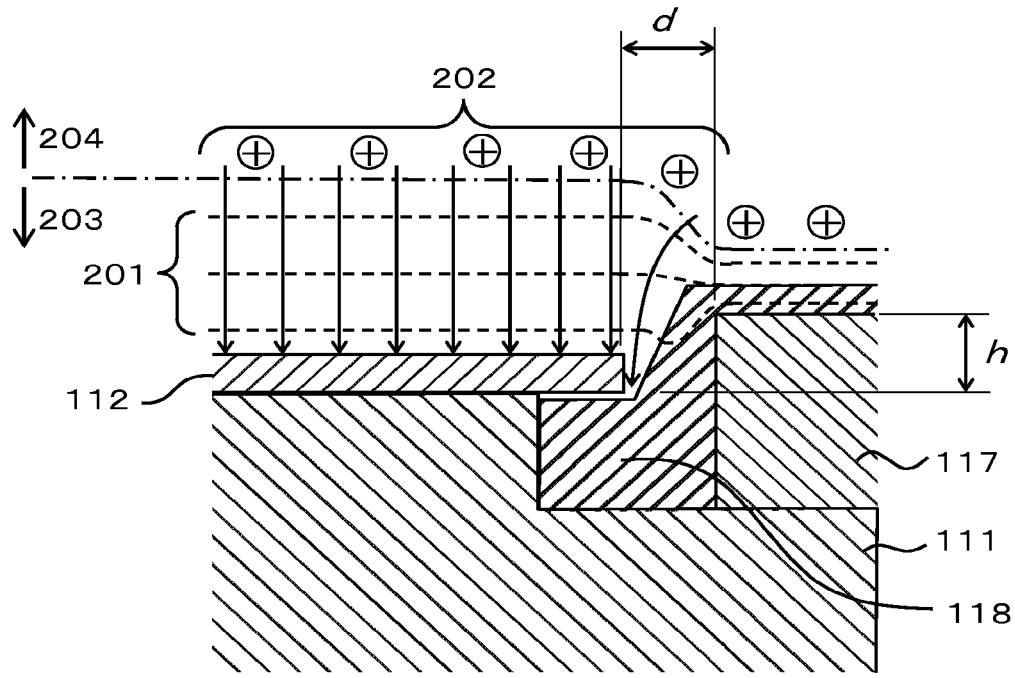
FIG. 2 is a vertical sectional view schematically showing an electric field distribution in the vicinity of a wafer outer edge part of a sample stage in the apparatus shown in FIG. 1.
Figure 5A:
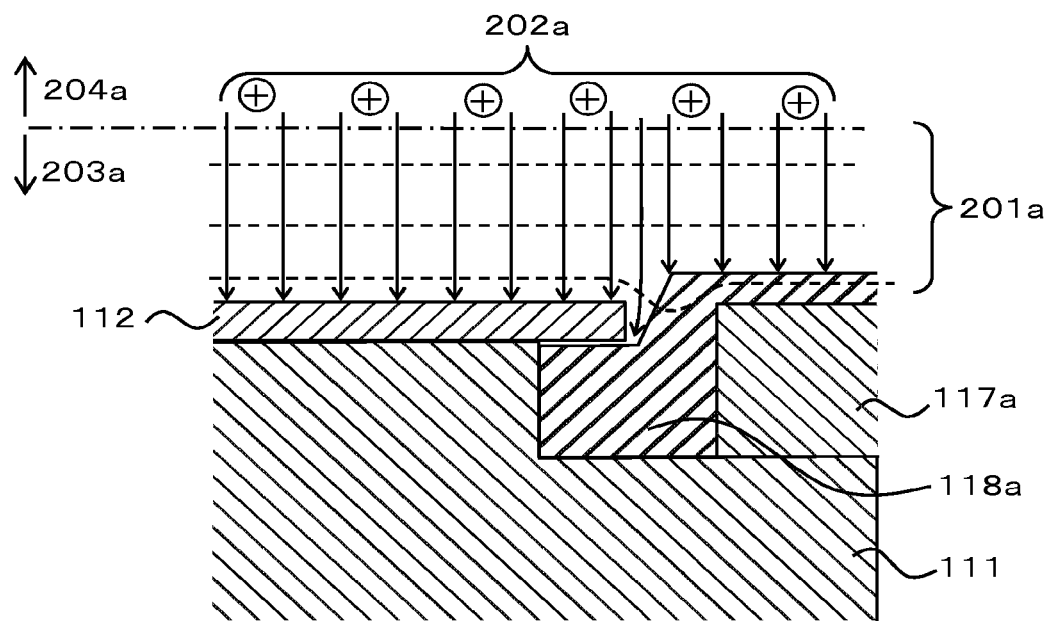
FIGS. 5A and 5B are longitudinal sectional view schematically showing an electric field distribution in the vicinity of a wafer outer edge part of the sample stage in the plasma processing apparatus by the conventional technology.
Figure 5B:
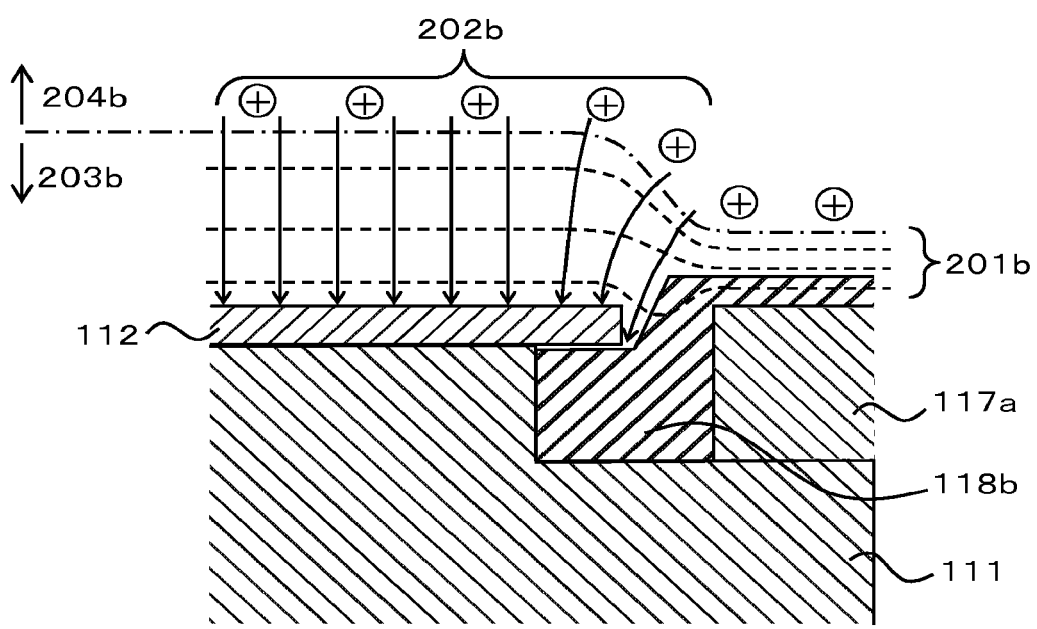

FIG. 2 shows a detailed structure of surroundings of a wafer mounting part of the sample stage 111. In this figure, the same symbol shows the same component in FIGS. 5A, 5B, and its explanation is omitted. A point in which this figure is different from FIG. 5B is that as compared with a case where the height of the top surface of a radio frequency ring 117 of FIG. 5B is set equal to or lower than a top surface of the wafer 112, the height of a top surface of the radio frequency ring 117 is set higher than the wafer top surface, having a distance of height h from the wafer mounting surface of the sample stage 111. Moreover, the inside diameter of the radio frequency ring 117 is larger than the outside diameter of the convex part of the sample stage 111, and is arranged having a distance d from an outer periphery of the wafer 112. The radio frequency ring 117 is arranged forming a shape that is a circle or is a set of multiple arcs linked together so that it may encircle the convex part of the sample stage 111 when seeing from the above. For a material of this radio frequency ring 117, a metal having conductivity, for example, aluminum, can be used. On the surface of the radio frequency ring 117, anodizing (alumite etc.) in order to suppress a surface reaction, abnormal discharge, etc. and a surface treatment of covering a body with a coating film of a dielectric, such as by flame spraying, is performed.

By the radio frequency ring 117 being conductive, the radio frequency bias power applied on the sample stage 111 is also transferred to the radio frequency ring 117 (the conductor ring), and the electric potential produced on the top surface of the radio frequency ring 117 (the conductor ring) becomes equal to the electric potential of the top surface of the convex part of the sample stage 111.

In order to make the sample stage 111 and the radio frequency ring 117 have the same potential, an electrode part of the sample stage 111 that is connected with the radio frequency power generator 114 and the radio frequency ring 117 are electrically connected in this case. As a method for electric connection, there are multiple methods as follows: the two conductive materials are made to connect with each other (being metal touched); the radio frequency ring 117 is fastened to the sample stage 111 with a bolt comprised of a conductive part; a conductive part contacting with these surfaces is arranged between the two parts; etc. Incidentally, although the radio frequency ring 117 was electrically connected with the electrode of the sample stage 111 in this case, it is important to transfer the radio frequency power to the radio frequency ring. As the one of the method, there is an insulating material between the radio frequency ring and the sample stage. Furthermore, the radio frequency ring 117 does not need to be a separate part, and it may be a single-piece type such that an outside part of the convex part of the sample stage 111, i.e., a part of the stepped part (convex part) may be protruded to be a ring shape.

In the stepped part outside of the convex part of the sample stage 111, a cover ring 118 (a dielectric cover) that covers the radio frequency ring 117 and is a ring-shaped part made of a dielectric having a material or thickness that does not allow the radio frequency bias from the radio frequency ring 117 to transfer is arranged. In this case, the cover ring 118 is comprised of quartz. Incidentally, the inner periphery side of the cover ring 118 that faces the wafer 112 has the same shape as that of the cover ring 118b in FIG. 5B.

In the apparatus constructed as described above, the wafer 112 is conveyed into the vacuum vessel 101 by a conveying device whose illustration is omitted, and is mounted on the sample stage 111. The wafer 112 placed and held on the sample stage 111 is etching processed by plasma generated in the processing chamber 110 and by the radio frequency bias applied to the sample stage 111.

In doing this, when the plasma is formed in the processing chamber 110 above the sample stage 111, at the same time a radio frequency power is applied to an electrode for radio frequency bias application of the sample stage 111 from the radio frequency power generator 114, and the radio frequency bias is applied to the wafer 112 through a dielectric film on a top surface of the sample stage 111; the plasma ion sheath is formed between the wafer 112 and the plasma, and a self bias potential is generated at the wafer 112. The ions (charged particles) in the plasma are drawn towards a wafer 112 top surface by this self bias electric potential, and etching layers on the wafer 112 is etching processed by the ions colliding the wafer 112. Incidentally, although not illustrated, while the etching process, a gas for heat transfer for promoting heat transmission, such as helium, is introduced between the backside of the wafer 112 and the sample stage 111 controlled to a prescribed temperature.

According to the radio frequency ring 117 (the conductor ring) and the cover ring 118 (the dielectric cover) of this apparatus, plasma is generated in the processing chamber 110, the radio frequency bias is applied to the sample stage 111, and a plasma region 204 and a plasma ion sheath region 203 as shown in FIG. 2 are formed. That is, by the radio frequency bias applying on the wafer 112, there is a large electric potential difference at an ion sheath, in other words, the ion sheath is thick, at over the cover ring 118 that is an outer peripheral part of the wafer 112 and among the radio frequency ring 117, there is a small electric potential difference at the ion sheath, in other words, the sheath thickness is thin. The equipotential surface in this ion sheath is shown by a symbol 201. In this plasma ion sheath region 203, the ions are accelerated perpendicularly to the equipotential surface 201, which makes an ion trajectory shown by a symbol 202. A density of the equipotential surfaces 201 becomes a large density on the wafer 112, and becomes a small density over the cover ring 118. For this reason, if a top surface height h of the top surface of the radio frequency ring 117 is lower than the wafer top surface, the depression (curvature) of an upper equipotential surface in the wafer outer peripheral part will become large.

Here, by the height of the top surface of the radio frequency ring 117 higher than the wafer 112 top surface, the depression of the whole equipotential surface in the outer peripheral part of the wafer 112, in other words, a curvature of the equipotential surface is suppressed (relaxed). Moreover, in this embodiment, there is a distance d between the wafer 112 outer periphery and the radio frequency ring 117, a position of the equipotential surface falls in the gap of the distance d, but this can be improved by making the height of the top surface of the radio frequency ring 117 higher: the position is improved so as to get closer to the wafer 112 top surface in parallel. For example, in order to suppress the curvature of the equipotential surface in the vicinity of an outer peripheral edge of the wafer 112 and to make it become parallel to the wafer 112, the height of the top surface of the radio frequency ring 117 of this embodiment is made such that its height h from the top surface of the sample stage 111 shall be higher than the wafer 112 top surface and less than or equal to 5.0 mm.

Incidentally, when the top surface of the radio frequency ring 117 is lower than the wafer 112 top surface, the hanging (the depression) of the equipotential surface in the vicinity of the outer peripheral edge of the wafer 112 cannot be suppressed, and therefore it becomes difficult to bring the wafer 112 and the equipotential surface closer in parallel in a wafer 112 outermost periphery. By setting the inside diameter of the radio frequency ring 117 to be within a predetermined distance to the outside diameter of the wafer 112, it is possible to suppress the hanging of the equipotential surface in the vicinity of the outer peripheral edge of the wafer 112. In this case, the distance d between the inner peripheral edge of the radio frequency ring 117 and the outer peripheral edge of the wafer 112 is set to be not less than 1.0 mm and not more than 10 mm. This is because if it is smaller than 1.0 mm, it is easy to discharge at the distance d; if it exceeds 10 mm, the depression of the equipotential surface will become large and an effect of the radio frequency ring will become impossible to be expected.

Since the equipotential surface 201 is curved slightly towards the stepped part (a concave part) of the sample stage 111 (in a downward direction of the figure) in the gap of the distance d, the equipotential surface 201 is curved slightly in the outer peripheral edge of the wafer 112, which makes the trajectory 202 of the charged particles, such as the ions, incident on the wafer 112 not perpendicular to the wafer, becoming slightly inclined. Since when the gap distance d becomes larger, the curvature of the equipotential surface 201 also increases, in order to bring the trajectory 202 close to be more perpendicular, it is necessary to increase the height h of the top surface of the radio frequency ring 117 from the top surface of the sample stage 111.

In this case, thickness of the dielectric part of the cover ring 118 that covers the top surface of the radio frequency ring 117 is set in a range of 1.0 to 5.0 mm inclusive. This is because, if the thickness of the cover ring 118 above the radio frequency ring 117 is smaller than 1.0 mm, it will be undesirable that the radio frequency bias power will transfer the cover ring 118 and couples with the plasma and the cove ring has degradation strength in the point of materials view and manufacturing view. Moreover, this is because, if the thickness is equal to or less than 5.0 mm, the covering 118 will act as a step to the wafer 112 and disturb gas flow on the wafer surface, which will easily cause a problem, such as byproducts generated from the wafer surface by etching reaction has a long residence time. As an upper limit to form this step, it is desirable that the height of a top surface of the cover ring 118 to the wafer 112 surface is 10 mm or less.

In this embodiment, since there is a distance d between the wafer 112 outer periphery and the radio frequency ring 117, a position of the equipotential surface in the vicinity of the wafer 112 falls slightly in the wafer outer peripheral part. Moreover, the plasma ion sheath over the cover ring 118 becomes thin. For this reason, the top surface of the radio frequency ring 117 is set higher than the wafer 112 top surface, so that the equipotential surface in the vicinity of the wafer 112 may be raised in the wafer outer peripheral part and the depression of the equipotential surface above the plasma ion sheath region 203 may be lessened. Thereby, a gradient of the ions accelerated in the upper part of the plasma ion sheath region 203 of the outer peripheral part of the wafer 112, in other words, the incident ion from the outside has small gradient. That is, the equipotential surface in the vicinity of the wafer 112 is aligned parallel to the wafer, and an incident direction of the ions accelerated in the plasma ion sheath region 203 becomes substantially more perpendicular to a processing surface of the wafer 112.

Moreover, in the etching process, the radio frequency bias power is altered according to processing conditions. If the radio frequency bias power is large, the plasma ion sheath will become thick; if the electric power becomes small, the plasma ion sheath will become thin. Since in accordance with this, when the radio frequency bias power is large, a difference of the plasma ion sheath thickness between the inner side and the outer side on the wafer 112 becomes large; therefore, the gradient of an oblique component of the ions incident perpendicularly to the equipotential surface in the upper part of the plasma ion sheath region 203 of the outer peripheral part of the wafer 112 becomes large. Moreover, since when the radio frequency bias power is small, the difference of the plasma ion sheath thickness between the inner side and the outer side on the wafer 112 becomes small, the gradient of the oblique component of the ions incident perpendicularly on the equipotential surface in the upper part of the plasma ion sheath region 203 of the outer peripheral part of the wafer 112 becomes small. Therefore, when the radio frequency bias power is small, the ions incident on the wafer 112 top surface become almost perpendicular, but when the radio frequency bias power becomes large, the ions incident on the wafer 112 top surface become easy to have a gradient component.

In this embodiment, by setting the top surface of the radio frequency ring 117 higher than the wafer 112 top surface as shown in FIG. 2, a difference between the height of the equipotential surface of the plasma ion sheath region 203 above the wafer 112 and the height of the equipotential surface above the radio frequency ring 117 becomes small compared with a case where the top surface of the radio frequency ring 117 is the same as the wafer 112 top surface; therefore, the influence of alteration of the radio frequency bias power can be reduced.

Figure 3:
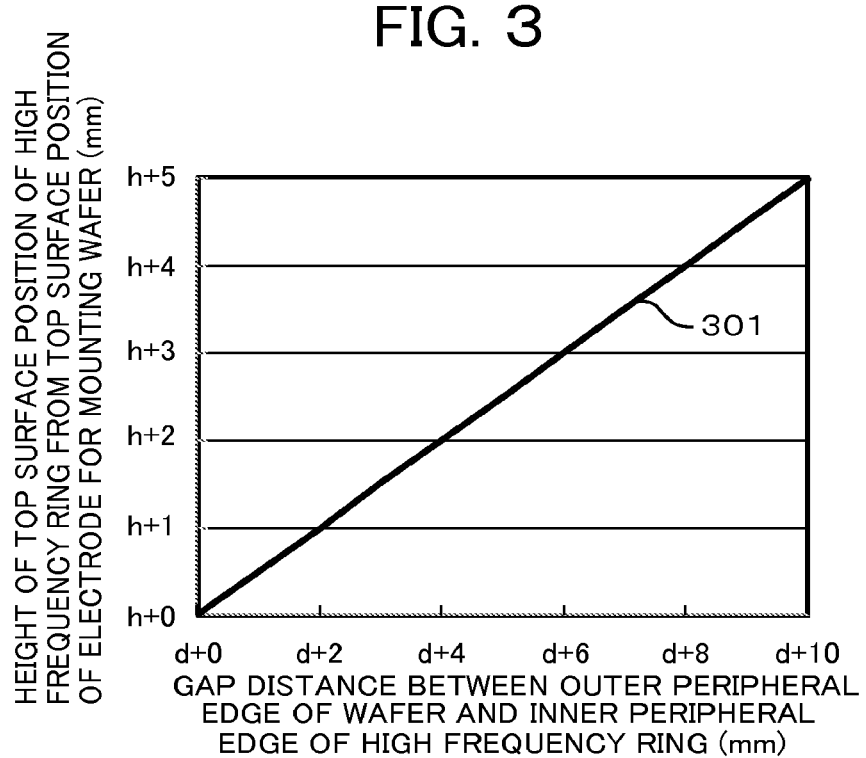
FIG. 3 is a graph showing a relationship (lower limit) of a height of a radio frequency ring top surface from a top surface of the sample stage to a distance between a wafer outer peripheral edge of the apparatus and an inner peripheral edge of a radio frequency ring shown in FIG. 1.

In consideration of these respects and in addition through an electric field analysis in the vicinity of the outer peripheral edge of the wafer 112 and an evaluation of an etching rate, a height of the top surface of the radio frequency ring 117 is optimized, and an evaluation by the present inventors makes clear a relationship between the height h and the distance d about the radio frequency ring 117 described above. FIG. 3 shows this. It is found that taking the distance d between the inner peripheral edge of the radio frequency ring 117 and the outer peripheral edge of the wafer 112 on the X-axis and taking the height h of the top surface of the radio frequency ring 117 from the top surface of the sample stage 111 on the Y-axis, an optimum value of the top surface height h of the radio frequency ring 117 to bring the equipotential surface above the outer peripheral edge of the wafer 112 close to the wafer 112 top surface in parallel varies in proportion to the distance d, and in this case, the present inventors have found that it is good just to vary an incremental size of the height h with a gradient of ½ with respect to the incremental size of the distance d. This optimum value is shown by a line 301.

Incidentally, in the case where the height h of the radio frequency ring is lower than the optimum value with respect to the distance d, if the radio frequency bias power becomes large, the gradient angle by which the equipotential surface above the plasma ion sheath region 203 of the outer peripheral part of the wafer 112 depresses to the outside will take a direction of becoming large, namely, the curvature of the equipotential surface of the outer peripheral part of the wafer 112 will become large and many of the ions incident having a gradient will tend to gather on the outer peripheral part of the wafer 112. For this reason, the ions act so that the etching rate in the outer peripheral part of the wafer 112 may become high. On the other hand, in the case where the height h of the radio frequency ring is higher than the optimum value with respect to the distance d, if the radio frequency bias power becomes small, the equipotential surface in the lower part of the plasma ion sheath region 203 of the outer peripheral part of the wafer 112 will have a gradient angle taking a direction of raising towards the outside, and the ions incident towards the wafer top surface 112 will be guided to the outside of the wafer 112 outer periphery, so that the ions incident on the outer peripheral part of the wafer 112 will tend to decrease. For this reason, the ions act so that the etching rate in the outer peripheral part of the wafer 112 may decrease.

Figure 4:
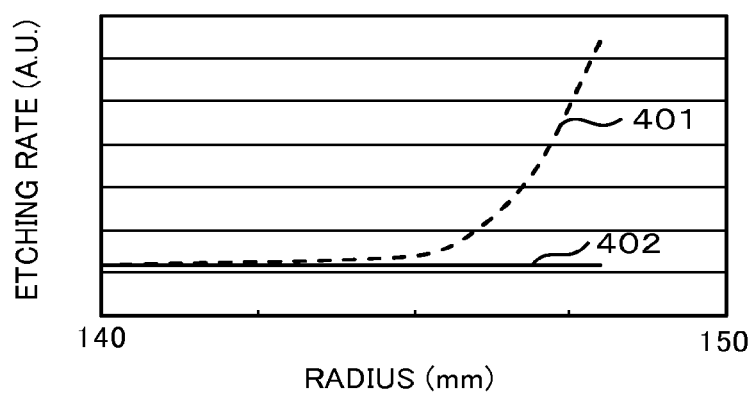
FIG. 4 is a graph showing an etching rate distribution of the outer peripheral part when the wafer is processed by the apparatus shown in FIG. 1.

FIG. 4 shows one example of an etching rate result in the case where the wafer 112 is processed using a plasma processing apparatus having the radio frequency ring 117 and the cover ring 118 that are thus optimized. In this case, a material to be etched was specified to be a silicon nitride film, and tetrafluoromethane gas, oxygen gas, and trifluoromethane gas were used as etching gases, for example.

A curve 401 shows an in-wafer distribution of the etching rate when the etching is processed with a conventional structure of the wafer peripheral part shown in FIG. 5B, especially that of the wafer outer peripheral part (E. E. part). A curve 402 shows an in-wafer distribution of the etching rate when the etching is processed with a structure of this embodiment, especially, that of the wafer outer peripheral part (E. E. part).

As shown by the curve 401, when the etching is performed with the conventional structure, the etching rate of the outer peripheral part of the wafer 112 increases rapidly and in-wafer 112 uniformity decreases. On the other hand, it is shown that by adopting a structure of this embodiment as shown by the curve 402, rapid increase of the etching rate in the peripheral part of the wafer 112 is suppressed and the in-wafer 112 etching rate uniformity is improved.

As described above, according to this embodiment, by using the radio frequency ring 117 that has the top surface higher than the wafer top surface placed on the sample stage and the cover ring 118 that does not allow the radio frequency bias to transfer to the plasma substantially, the plasma ion sheath formed outside the wafer outer periphery of the sample stage to which the radio frequency bias is applied is made to have substantially the plasma ion sheath potential produced only by the plasma generation, the thickness of the plasma ion sheath outside the wafer outer periphery is set to be constant irrespective of largeness of the radio frequency bias power, and the equipotential surface is made higher than the wafer top surface in this state. By this, as compared with a case where the height of the top surface of the radio frequency ring is equal to that of the wafer top surface, it is possible to make small the difference between the height of the equipotential surface above the wafer in the plasma ion sheath region and the height of the equipotential surface above the radio frequency ring, so that the influence of alteration of the radio frequency bias can be reduced, and it is possible to suppress the depression of the equipotential surface in the wafer outer peripheral part. By this, it is possible to make substantially perpendicular the incident angle of the ions incident on the wafer outer peripheral part (E. E. region) with a reduced influence of alteration of the radio frequency bias power, and to better the uniformity of device performance by improving an etching performance of the edge exclusion (E.E.) region.

That is, by making the radio frequency ring 117 have a top surface higher than the wafer top surface, it is possible to let the equipotential surface above the wafer 112 to have a smaller curvature angle towards the lower side to the radio frequency ring 117 in the outer peripheral edge of the wafer 112 and its outer peripheral side, namely, it is possible to suppress the curvature and to align parallel to the wafer 112 top surface. In other words, by raising the equipotential surface above the radio frequency ring 117 to a higher position than that above the wafer surface in the vicinity of the wafer 112 outer periphery, it is possible to let the equipotential surface above the wafer 112 to have a smaller curvature angle showing depression downward between the outer peripheral edge of the wafer 112 (including its outer periphery side) and the radio frequency ring 117. Moreover, by using the cover ring 118 that does not allow the radio frequency bias to transfer to the plasma, it is possible to thin the thickness of the plasma ion sheath over the cover ring 118. Thereby, the equipotential surface outside the wafer 112 outer periphery can be made constant (fixed) to the radio frequency bias, and it becomes easy to set the height of the top surface of the radio frequency ring 117 without being affected by processing conditions, especially by the radio frequency bias power.

By this, as shown in FIG. 2, the equipotential surface 201 is kept parallel to the wafer 112 from a wafer 112 central part to its outer peripheral edge, and it is possible to make the trajectory 202 of the ions that are incident perpendicularly on the equipotential surface substantially perpendicular to the wafer 112 on its top surface as far as the outside of the outer peripheral edge of the wafer 112. Therefore, the number of the ions incident on the outer peripheral edge from the wafer 112 central part can be made uniform, and the etching rate can be made uniform in a wafer 112. That is, the uniformity of the etching rate from the wafer 112 central part to the outer peripheral edge (E. E. part) is improvable.

Moreover, the ions are incident on the wafer 112 perpendicularly also in the outer peripheral edge of the wafer 112 and an etched profile becomes a vertical shape. By this, the etched profile can be controlled with high precision, and impairment of electric characteristics and performance of the semiconductor device in the outer peripheral edge of the wafer 112 is suppressed, which brings about an effect of raising a yield.

Moreover, according to this embodiment, the electric potential on the wafer 112 and the surface potential of the radio frequency ring 117 are always equal, and the curvature of the equipotential surface of the outer peripheral part of the wafer 112 can be suppressed even when the processing conditions to the wafer 112, especially the radio frequency bias power, may change. That is, even when the processing conditions alter, it is possible to make the equipotential surface in the vicinity of the outer peripheral part of the wafer 112 parallel to the wafer 112 even if the size of the radio frequency ring 117 is not optimized each step, which improves an efficiency of the plasma etching.

Moreover, in this embodiment, the thickness and material (dielectric constant) of the dielectric part of the cover ring 118 are decided so that the radio frequency bias power applied to the radio frequency ring 117 may not couple with the plasma through the cover ring 118 and may not form the plasma ion sheath without applying the radio frequency bias power on the surface of the dielectric part. Thereby, not the plasma ion sheath formed when the radio frequency bias is applied but the plasma ion sheath that has about plasma potential produced only by the plasma generation is formed on the surface of the cover ring 118 above the radio frequency ring 117 of this embodiment. The thickness of this plasma ion sheath becomes the same thickness as the thickness of the plasma ion sheath formed on the wafer 112 top surface when the plasma is formed in the processing chamber 110 with the radio frequency bias power being not supplied to the sample stage 111. By this, a sputtering and an etching by ions on the cover ring 118 top surface are reduced, and depletion of the cover ring 118 lessens, which prolongs the lifetime.

Incidentally, in the above-mentioned embodiment, when a ratio of an impedance to the plasma of the radio frequency bias power supplied to the electrode part in the sample stage 111 through the mounting surface on which the wafer 112 is mounted and the wafer 112 and an impedance to the plasma through a radio frequency ring 117 and a cover ring 118 made of a dielectric above it (a ratio of the latter to the former) is five or more, it can be considered that there is no coupling with the plasma of the latter, that is, the radio frequency bias power from the radio frequency ring 117 does not transfer to the plasma practically.

Moreover, this embodiment is a plasma processing apparatus that has the vacuum vessel forming a processing chamber into which a processing gas is supplied and whose interior is exhausted to reduce its pressure to form plasma of the processing gas, the sample stage that is placed in this processing chamber and holds a wafer to be processed on its top surface, and the convex-shaped electrode that constitutes a wafer holding part of the sample stage and is connected with the radio frequency power generator and to which the radio frequency bias power is applied, and processes the wafer using the plasma generated in the processing chamber while applying the radio frequency bias power thereto, characterized in that the plasma processing apparatus has the ring-shaped part made of the conductor that is arranged in a stepped part formed on an outer periphery side of the wafer holding surface of the electrode encircling the convex part of the electrode and applies the radio frequency bias power applied to the electrode, and the cover made of the dielectric that is arranged in the stepped part covering a top surface and an inner periphery side of the ring-shaped part, the cover substantially blocking transition of the radio frequency power from the ring-shaped part to which the radio frequency power is applied to the plasma, and the top surface of the ring-shaped part is set higher than the wafer top surface placed on the sample stage.

Moreover, this embodiment is a plasma processing method having the steps of: placing and holding the wafer to be processed on the top surface of the sample stage arranged in the processing chamber whose interior is decompressed, forming plasma of a processing gas in the processing chamber, and processing the wafer while applying the radio frequency bias power to the sample stage from the radio frequency power generator, characterized in that in a stepped part formed on an outer peripheral side of the wafer holding surface of the sample stage, the ring-shaped part made of the conductor that encircles a convex part that is its inside and has a top surface higher than the top surface of the wafer held on a wafer holding surface and the cover made of the dielectric material that covers a top surface and an inner periphery side of the ring-shaped part are arranged, the radio frequency bias is applied to the wafer through the sample stage, the cover cut off a transition of the radio frequency bias to the plasma during etching process.

Although, in the above embodiment, the etching apparatus using the microwave ECR electric discharge was explained as an example, the same action effect is achieved also in dry etching apparatuses using other electric discharges (effective magnetic field UHF electric discharge, capacity coupling type electric discharge, inductive coupling type electric discharge, magnetron electric discharge, surface wave excitation electric discharge, transfer coupled electric discharge). Moreover, in the above-mentioned embodiment, although the etching apparatus was described, the same action and effect are given to other plasma processing apparatuses performing the plasma processing using the radio frequency bias, for example, a plasma CVD apparatus, an ashing apparatus, and a surface reforming apparatus, etc.

Incidentally, the present invention is not limited to the above-mentioned embodiment, and may include various modifications. For example, the embodiment described above was explained in detailed just to give comprehensible explanations of the present invention and they are not necessarily limited to one that has the entire configuration being explained.

What is claimed is:

1. A plasma processing method for processing a sample which is placed on an upper surface of a sample stage disposed in a processing chamber, the method further comprising the steps of:
    generating plasma using a processing gas supplied into the processing chamber which is decompressed to a predetermined pressure; and
    applying radio frequency power while the plasma is generated from a radio frequency power generator to an electrode inside the sample stage making bias potential using the radio frequency power over a surface of the sample placed on the upper surface of the sample stage and to a ring-shaped member which is made of a conducting material and arranged in an outer circumferential region of the upper surface of the sample stage,
    wherein at least a top surface and an inner side surface of the ring-shaped member is covered against the plasma by a dielectric cover ring member which is arranged in an outer circumferential region of the upper surface of the sample stage,
    wherein a distance between an outer peripheral edge of the sample and an inner peripheral edge of the ring-shaped member is set between 1.0 mm to 10.0 mm, and an impedance of the radio frequency power between the ring-shaped member and the plasma through the dielectric cover ring member is larger than five times the impedance of the radio frequency power between the electrode inside the sample and plasma through the sample placed on the upper surface of the sample state, and the top surface of the ring-shaped member is set higher than the upper surface of the sample stage by a half of the distance between the outer peripheral edge of the sample and the inner peripheral edge of the ring-shaped member, and
    wherein the radio frequency power applied to the electrode inside the sample stage from the radio frequency power generator is altered according to processing conditions for the sample while the radio frequency power applied to the ring-shaped member is not coupled to the plasma and does not make bias potential by the radio frequency power over the dielectric cover ring member which covers the ring-shaped member, and a thickness of a plasma ion sheath over the dielectric ring member is smaller than the thickness of the plasma ion sheath over the sample on the upper surface of the sample stage.

2. The plasma processing method according to claim 1, wherein an equipotential height of a top end of the plasma ion sheath over the dielectric ring member is lower than the equipotential height of the top end of the plasma over the sample on the upper surface of the sample stage.

3. The plasma processing method according to claim 1, wherein the top surface of the ring-shaped member is set higher than the sample top surface by a range of 5.0 mm or less.

4. The plasma processing method according to claim 1, wherein the top surface of the ring-shaped member is set higher than the sample top surface, being raised by a range of 5.0 mm or less, and a inner diameter of the ring-shaped member is larger than a diameter of the sample by a range of 1.0 to 10 mm.

5. The plasma processing method according to claim 1, wherein the thickness of a portion of the dielectric ring member disposed above the ring-shaped member and covers the same is in a range of 1.0 mm to 5.0 mm.

6. The plasma processing method according to claim 3, wherein the thickness of a portion of the dielectric ring member disposed above the ring-shaped member and covers the same is in a range of 1.0 mm to 5.0 mm.

7. The plasma processing method according to claim 4, wherein the thickness of a portion of the dielectric ring member disposed above the ring-shaped member and covers the same is in a range of 1.0 mm to 5.0 mm.

* * * * *